United States Patent
Yuan et al.

(10) Patent No.: US 8,677,291 B1
(45) Date of Patent: Mar. 18, 2014

(54) DOUBLE PATTERNING COMPATIBLE COLORLESS M1 ROUTE

(71) Applicants: Lei Yuan, Cupertino, CA (US);
Jongwook Kye, Pleasanton, CA (US);
Mahbub Rashed, Cupertino, CA (US);
Qinglei Wang, San Jose, CA (US)

(72) Inventors: Lei Yuan, Cupertino, CA (US);
Jongwook Kye, Pleasanton, CA (US);
Mahbub Rashed, Cupertino, CA (US);
Qinglei Wang, San Jose, CA (US)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 13/646,760

(22) Filed: Oct. 8, 2012

(51) Int. Cl.
*G06F 17/50* (2006.01)

(52) U.S. Cl.
USPC ............... 716/55; 716/50; 716/51; 716/52; 716/53; 716/54

(58) Field of Classification Search
USPC .............. 716/54, 55, 113, 119, 126, 135
See application file for complete search history.

(56) References Cited

U.S. PATENT DOCUMENTS

| | | | |
|---|---|---|---|
| 6,948,141 B1* | 9/2005 | Satya et al. | 716/52 |
| 8,136,072 B2* | 3/2012 | Frederick | 716/119 |
| 8,375,348 B1* | 2/2013 | Raj et al. | 716/126 |
| 2011/0119648 A1* | 5/2011 | Chen et al. | 716/126 |
| 2012/0216157 A1* | 8/2012 | Luo et al. | 716/55 |
| 2012/0288786 A1* | 11/2012 | Huang et al. | 430/5 |

* cited by examiner

*Primary Examiner* — Vuthe Siek
*Assistant Examiner* — Brian Ngo
(74) *Attorney, Agent, or Firm* — Ditthavong Mori & Steiner, P.C.

(57) ABSTRACT

A method for enabling functionality in circuit designs utilizing colorless DPT M1 route placement that maintains high routing efficiency and guarantees M1 decomposability of a target pattern and the resulting circuit are disclosed. Embodiments include: determining a boundary abutting first and second cells in an IC; determining a side of a first edge pin in the first cell facing a side of a second edge pin in the second cell; determining a first vertical segment of at least a portion of the side of the first edge pin and a second vertical segment of at least a portion of the side of the second edge pin; designating an area between the first vertical segment and the boundary as a first portion of a routing zone; and designating an area between the second vertical segment and the boundary as a second portion of the routing zone.

19 Claims, 9 Drawing Sheets

DOUBLE PATTERNING COMPATIBLE COLORLESS M1 ROUTE

TECHNICAL FIELD

The present disclosure relates to a selection and placement of route patterns in an integrated circuit (IC) to improve routing efficiency, chip scaling, and circuit performance. The present disclosure is particularly applicable to IC designs in 20 and 14 nanometer (nm) technology nodes and beyond utilizing double patterning technology (DPT).

BACKGROUND

In placement and routing (P&R) technologies for IC design, use of metal 1 (M1) back-to-back (B2B) routes improves routing efficiency, chip scaling, and circuit performance. FIG. 1 illustrates an exemplary P&R layout of a M1 layer. As shown, cells 101a and 101b have edge pins 103a and 103b connected by M1 B2B route 105. Additionally, the M1 layer includes a power rail 107 (e.g., $V_{ss}$) and ground rail 109 (e.g., $V_{dd}$). As illustrated in FIG. 1, M1 B2B routes 105 improve routing efficiency, chip scaling, and circuit performance, by, for instance, enabling different cells (e.g., 101a and 101b) to be connected via edge pins (e.g., 103a and 103b) within the M1 layer. That is, M1 B2B routes 105 remove the need to connect edge pins (e.g., 103a, 103b) using another layer (e.g., metal 2 layer).

However, features (e.g., routes, edge pins, etc.) and pitches (e.g., spacing between features) of IC designs continue to decrease in size. In order to support such features and pitches, many IC designs form features utilizing DPT. FIG. 2 illustrates an exemplary DPT process. As shown, an overall route pattern 201 is generated from a partial route pattern 201a formed by a first mask (and/or color space) and a partial route pattern 201b formed by a second mask (and/or second color space). By using two separate masks (and/or color spaces), the pitch 203 between features using DPT may be less than (e.g., half) a pitch using a single mask, such as pitch 203a and pitch 203b. IC designs utilizing DPT, however, require zero odd cycles for the designs to be decomposable by the separate masks. Additionally, some odd cycles may be removed using a stitch (e.g., a continuous metal geometry/polygon decomposed into two masks). Stitch generation, however, utilizes complicated stitching color (DPT) rules, particularly in the M1 layer. Thus, a layout decomposition tool, rather than traditional IC P&R technologies, utilizes the stitching color rules to generate stitches.

As such, traditional P&R technologies utilizing DPT either require compliance with color rules (i.e., without the stitching color rules), as described further with respect to FIG. 3, or ignore the affect of DPT, as described further with respect to FIG. 4.

Traditional P&R routing technologies utilizing color rules guarantee M1 decomposability, but generate IC designs having reduced routing efficiency. Adverting to FIG. 3, a target pattern 301 for the M1 layer is composed of edge pins 303 and 305 connected together by a target M1 B2B route 307. A first mask having a critical dimension (CD) 309 is designated to decompose a partial pattern 301a having edge pin 303. Similarly, a second mask having the CD 309 is designated to decompose a partial pattern 301b having edge pin 305. Traditional P&R routing technologies are unaware of stitching color rules and thus generate a route (not shown) connecting edge pins 303 and 305 in another layer (e.g., metal layer 2) rather than generating the M1 B2B route 307. As such, traditional P&R technologies using color rules overly restrict the generation of M1 B2B routes resulting in reduced routing efficiency, chip scaling, and circuit performance of a resulting IC design. Additionally, color rules in the M1 layer are particularly difficult to implement because M1 layer geometries of standard cells frequently contain two-dimensional shapes that require complicated color rules.

Traditional P&R technologies ignoring the effect of DPT rules (i.e., colorless) may allow for additional M1 B2B routes, but do not guarantee M1 decomposability. Adverting to FIG. 4, a target pattern 401 for the M1 layer includes edge pins 403, 405, and 407, with edge pins 403 and 407 connected together by a target M1 B2B route 409. Similar to FIG. 3, the M1 B2B route 409 cannot be decomposed using a single mask. A first mask is designated to decompose a partial pattern 401a having edge pin 403 and a part 409a of M1 B2B route 409. Similarly, a second mask is designated to decompose a partial pattern 401b having edge pins and 405 and 407, and a part 409b of M1 B2B route 409. However, the second mask cannot decompose partial pattern 401b due to a tip-to-tip conflict between edge pin 405 and a part 409b of M1 B2B route 409. Specifically, tip-to-tip distance 411 between edge pin 405 and the part 409b of M1 B2B route 409 is less than a CD for the second mask, resulting in an odd (e.g., three) number of masks being required to decompose the target pattern 401. As such, the M1 B2B route 409 is not decomposable in the masks separately or in combination. Thus, traditional colorless P&R technologies may result in M1 layers that cannot be decomposed utilizing DPT.

A need therefore exists for a methodology enabling M1 B2B routes that maintain high routing efficiency and guarantee M1 decomposability of a target pattern, and a resulting IC.

SUMMARY

An aspect of the present disclosure is a method including designating an area between edge pins as routing area.

Another aspect of the present disclosure is a circuit having each route connecting edge pins separated from corners of facing sides of the edge pins connected by each route.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: determining a boundary abutting first and second cells in an IC; determining a side of a first edge pin in the first cell facing a side of a second edge pin in the second cell; determining a first vertical segment of at least a portion of the side of the first edge pin and a second vertical segment of at least a portion of the side of the second edge pin; designating an area between the first vertical segment and the boundary as a first portion of a routing zone; and designating an area between the second vertical segment and the boundary as a second portion of the routing zone.

Some aspects include a method wherein the first vertical segment is separated from at least one corner on the side of the first edge pin by at least a predefined distance. Additional aspects include a method wherein the first and second edge pins are designated as decomposable in a single layer using a plurality of masks, the method including: determining the predefined distance based on a side-to-side, tip-to-side, or tip-to-tip minimum resolution of a single patterning, for at least one of the plurality of masks, or a combination thereof.

Further aspects include a method wherein the first vertical segment is separated from both corners on the side of the first edge pin by at least the predefined distance.

Additional aspects include: determining a side of a third edge pin in the first cell facing the side of the second edge pin; determining a third vertical segment comprising at least a portion of the side of the third edge pin, wherein the third vertical segment is separated from at least one corner on the side of the third edge pin by at least the predefined distance; and designating an area between the third vertical segment and the boundary as a third portion of the routing zone. Some aspects include a method wherein the second vertical segment is separated from at least one corner on the side of the second edge pin by at least the predefined distance. Additional aspects include: determining a first critical corner on the side of the first edge pin based on the first critical corner being separated from an outer edge of the first cell by the third edge pin, wherein the first vertical segment is separated from the first critical corner by at least the predefined distance; and determining a second critical corner on the side of the third edge pin based on the second critical corner being separated from an outer edge of the first cell by the first edge pin, wherein the third vertical segment is separated from the second critical corner by at least the predefined distance. Further aspects include designating a route, connecting the first and second edge pins, to be decomposable based on the route being placed inside the routing zone. Some aspects include: designating the first edge pin to be decomposed in a single layer using a first mask; designating the second edge pin to be decomposed in the single layer using a second mask; and designating the route to be decomposed in the single layer using the first and second masks.

Another aspect of the present disclosure is a circuit including: a plurality of cells in an IC; a plurality of edge pins in the cells, each edge pin being in one of the cells; and a plurality of routes connecting the edge pins, each of the routes connecting one edge pin in one of the cells to another edge pin in another cell that is adjacent to the one cell, wherein each of the routes is placed between portions of facing sides of the edge pins connected by the route, the portions being separated from corners of the facing sides.

Aspects include a circuit wherein the routes and edge pins are formed in a single layer. Further aspects include a circuit wherein the single layer consists of the routes and edge pins. Additional aspects include a circuit wherein the routes and edge pins have a minimum resolution less than a minimum resolution of single patterning of a mask associated with the single layer, the minimum resolution of the routes and edge pins being based on a side-to-side, tip-to-side, and tip-to-tip minimum resolution of the routes and edge pins. Some aspects include a circuit wherein each of the routes is separated from at least one corner of each edge pin connected by the route by at least the minimum resolution of single patterning. Further aspects include a circuit wherein each of the routes is separated from corners of each edge pin connected by the route by at least the minimum resolution of single patterning. Additional aspects include a circuit wherein at least one of the routes is decomposed in the single layer by a plurality of masks. Some aspects include a circuit wherein at least one cell of the cells has two or more edge pins, each of the two or more edge pins being connected to an edge pin of the adjacent cell by the routes.

Another aspect of the present disclosure is a method including: determining a boundary abutting first and second cells in an IC; determining a side of a first edge pin in the first cell facing a side of a second edge pin in the second cell; designating the first edge pin to be decomposed in a single layer using a first mask; designating the second edge pin to be decomposed in the single layer using a second mask; determining a first vertical segment of at least a portion of the side of the first edge pin, wherein the first vertical segment is separated from at least one corner on the side of the first edge pin by at least a predefined distance, and wherein the predefined distance is based on a side-to-side, tip-to-side, or tip-to-tip minimum resolution of a single patterning of the first and/or second masks, or a combination thereof; determining a second vertical segment of at least a portion of the side of the second edge pin, wherein the second vertical segment is separated from at least one corner on the side of the second edge pin by at least the predefined distance; designating an area between the first vertical segment and the boundary as a first portion of a routing zone; designating an area between the second vertical segment and the boundary as a second portion of the routing zone; designating a route connecting the first and second edge pins to be decomposable based on the route being placed inside the routing zone; and designating the route to be decomposed in the single layer using the first and second masks.

Some aspects include a method wherein the first vertical segment is separated from both corners on the side of the first edge pin by at least the predefined distance, and wherein the second vertical segment is separated from both corners on the side of the second edge pin by at least the predefined distance. Additional aspects include determining a critical corner on the side of the first edge pin based on the critical corner being separated from an outer edge of the first cell by another edge pin, wherein the first vertical segment is separated from the first critical corner by at least the predefined distance.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of routing inefficiency attendant upon utilizing DPT for forming B2B routes in IC designs. In accordance with embodiments of the present disclosure, the problems are solved, for instance by, inter alia, designating, within adjacent cells, a routing zone configured to ensure that routes placed in the routing zone are decomposable with routes and edge pins placed inside the adjacent cells.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
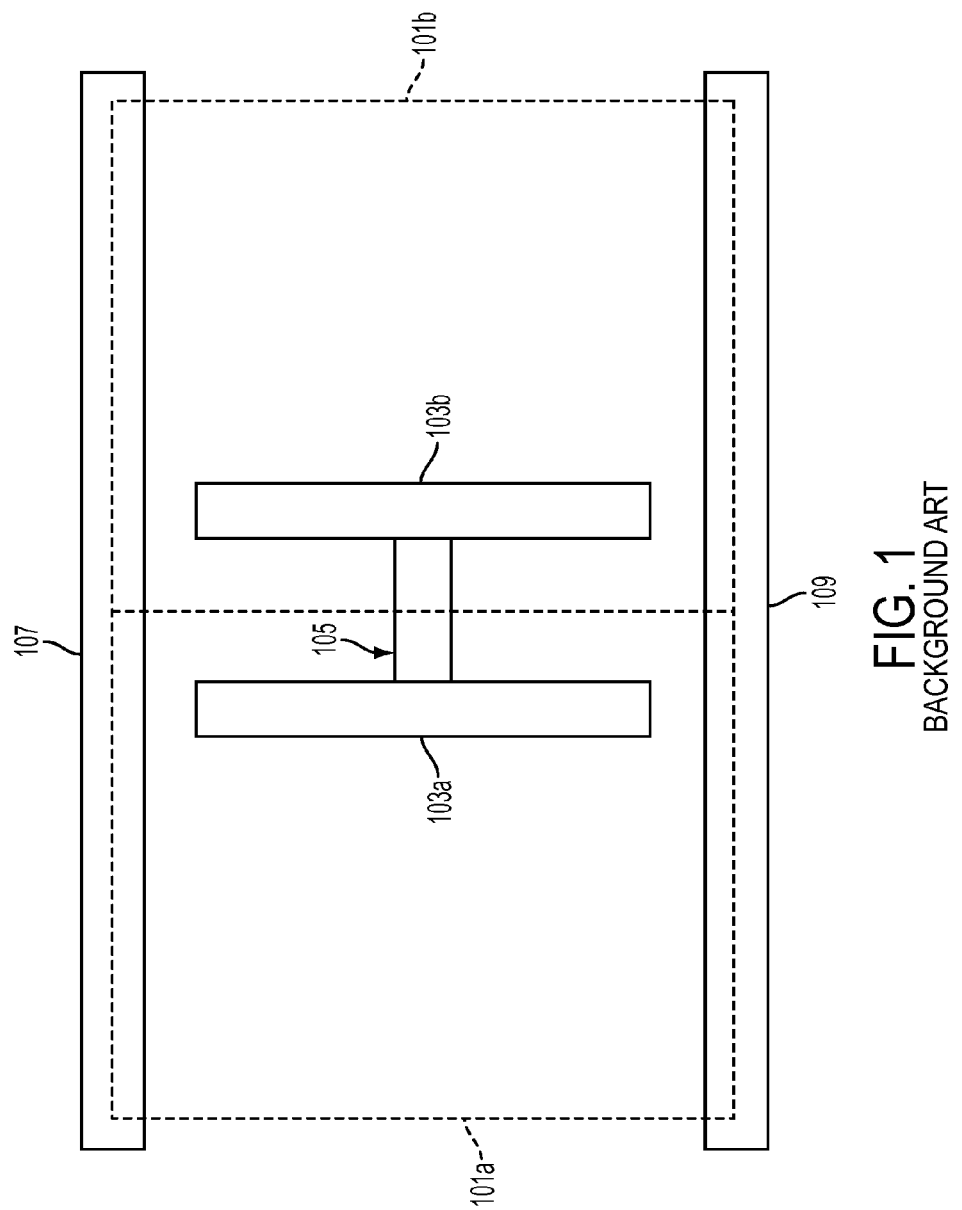
FIG. 1 illustrates an exemplary P&R layout of a M1 layer.
Figure 2:
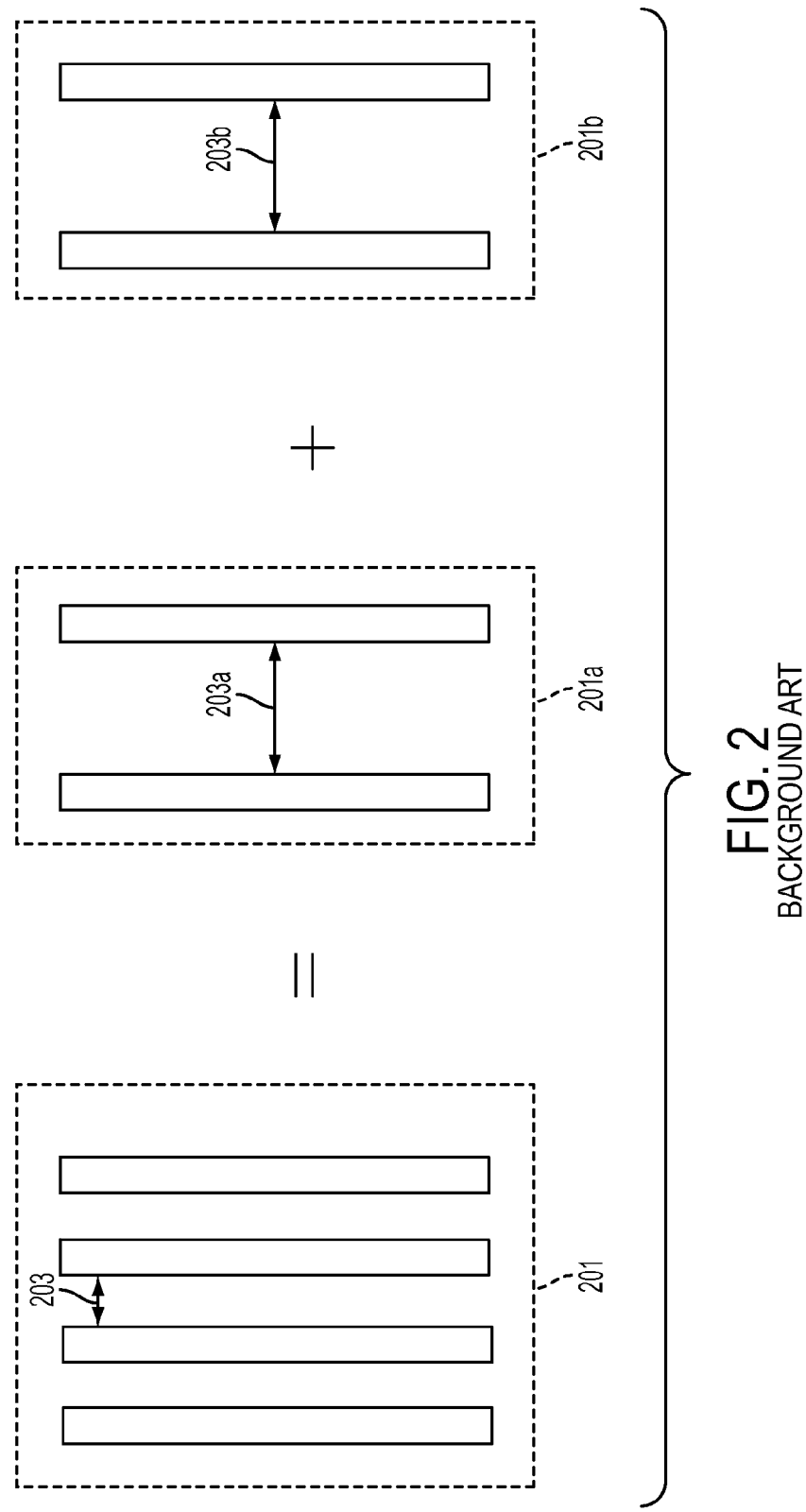
FIG. 2 illustrates an exemplary DPT process.

IC designs frequently contain multiple cells having edge pins for connecting one cell to another adjacent cell. Edge pins (e.g., border pins) include, for example, metal line type features that border their respective cells, and may be any polygon shape. Additionally, edge pins (e.g. 103a and 103b) may be placed near edges (or borders) of the cells (as shown in FIG. 1) but separated from edges to ensure M1 B2B routes (e.g., 105) placed between facing edge pins (as shown in FIG. 1) allow for use of stitching (e.g., overlapping routing lines or other features) to further improve routing efficiency, chip scaling, and circuit performance. Stitching is further addressed with respect to FIG. 8.

Figure 5A:
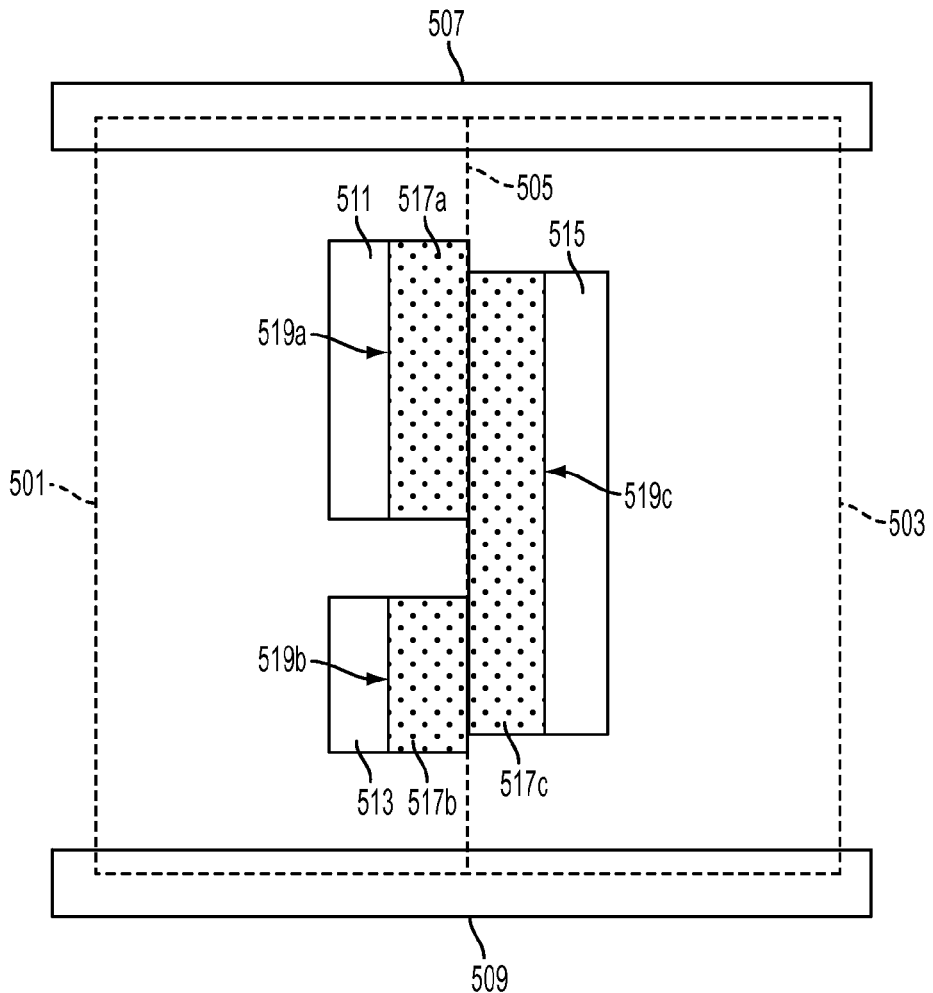
FIGS. 5 through 8 illustrate a DPT compatible colorless process that guarantees decomposability, in accordance with an exemplary embodiment, with FIGS. 5A and 5B illustrating alternative beginning cell structures.

Adverting to FIG. 5A, cells 501 and 503 abut a boundary 505 and have access to power rail 507 and a ground rail 509. Cell 501 contains edge pins 511 and 513 and cell 503 contains edge pin 515. Cells 501 and 503 may contain additional or fewer edge pins (not shown). A first part 517a of a routing zone 517 includes an area between a first vertical segment 519a of at least part of a side of the edge pin 511 and the boundary 505. Similarly, a second part 517b of a routing zone 517 includes an area between a second vertical segment 519b of at least part of a side of the edge pin 513 and the boundary 505. Likewise, a third part 517c of a routing zone 517 includes an area between a third vertical segment of at least part of a side of the edge pin 515 and the boundary 505. The routing zone 517 may be designated for placement of B2B routes (not shown), for instance, to connect edge pins 511 and 513 to edge pin 515. M1 routes (e.g., B2B) are forbidden outside of routing zone(s).

Figure 5B:
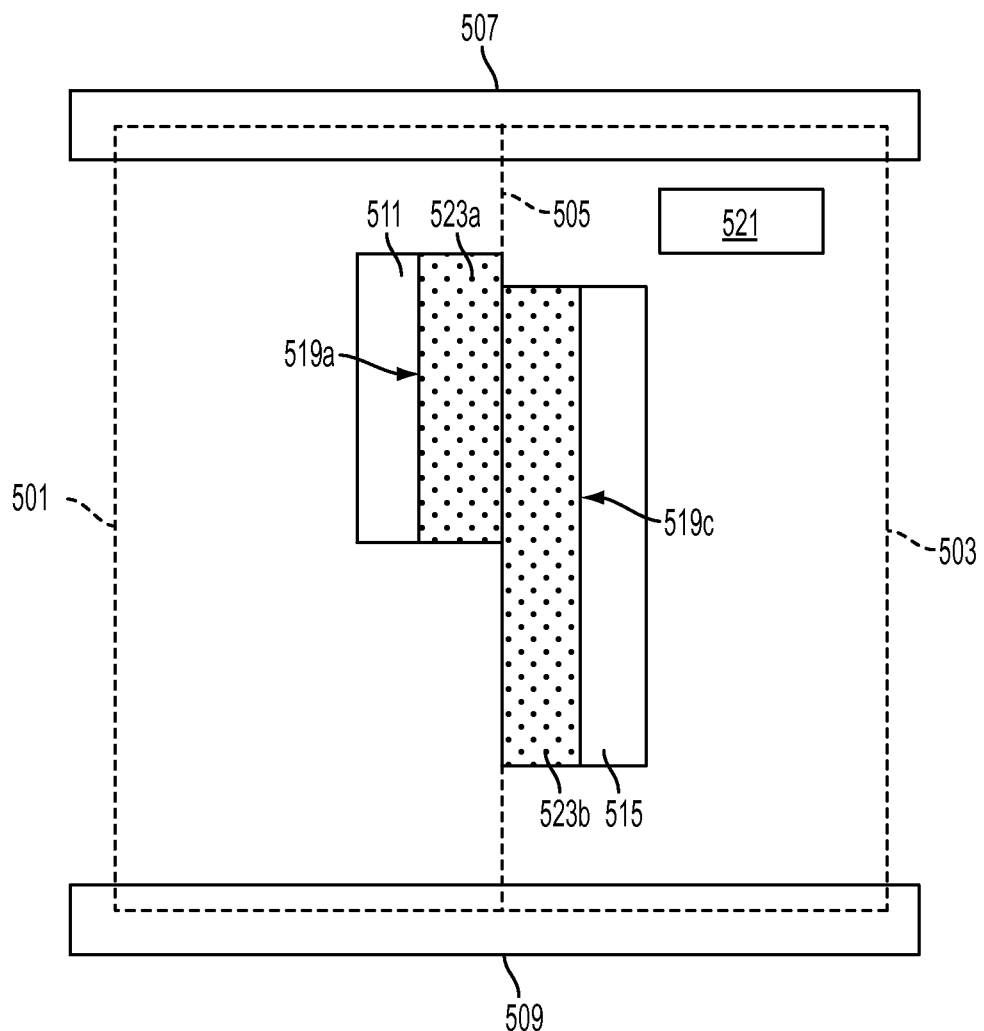

An embodiment shown in FIG. 5B is similar to the embodiment shown in FIG. 5A, but without edge pin 513, and with inside pin 521 added to cell 503. As illustrated, a first part 523a of a routing zone 523 includes an area between a first vertical segment 519a of at least part of a side of the edge pin 511 and the boundary 505. Similarly, a second part 523b of a routing zone 523 includes an area between the third vertical segment 519c of at least part of a side of the edge pin 515 and the boundary 505. In FIGS. 5A and 5B, each routing zone is shown between an entire side of an edge pin and boundary 505.

Figure 6:
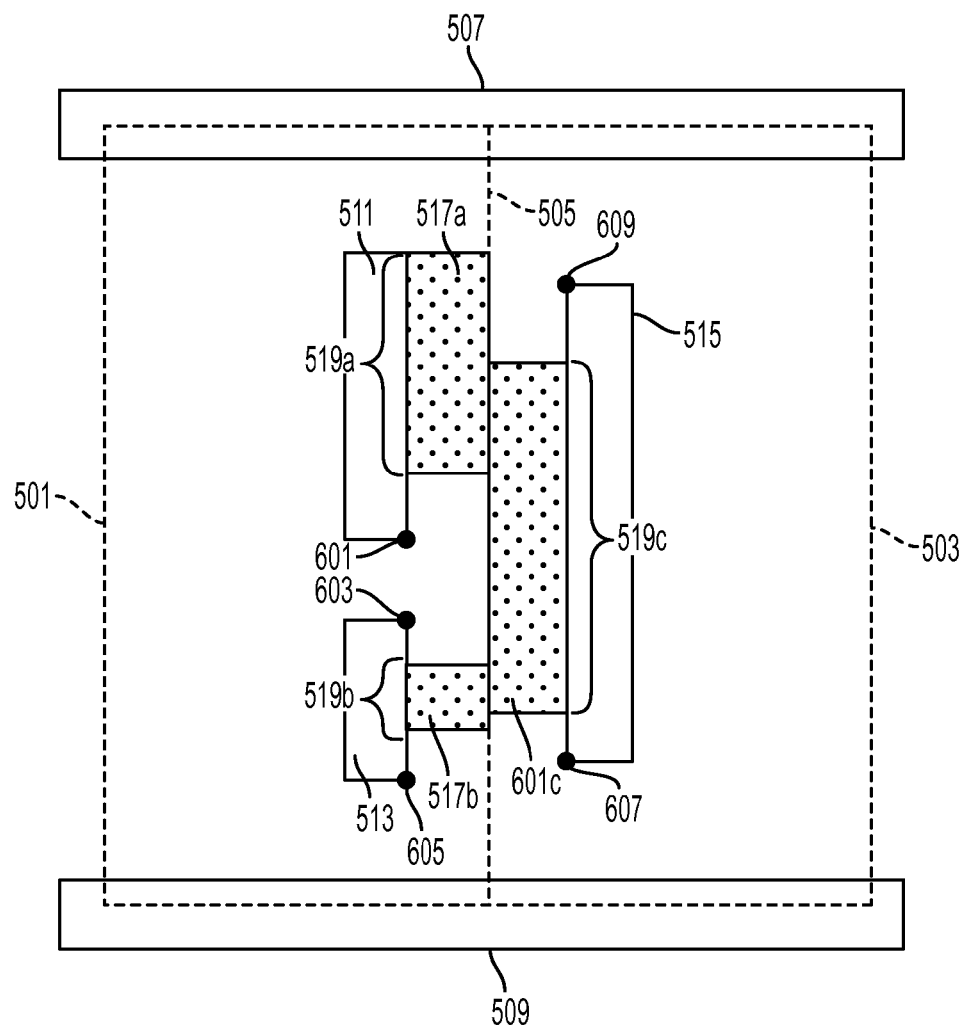

Adverting to FIG. 6, the routing zone 517 may be reduced, as from that illustrated in FIG. 5A, by separating each vertical segment 519 from at least one corner on the side of its corresponding edge pin. For instance, the first vertical segment 519a is separated from corner 601, vertical segment 519b is separated from corners 603 and 605, and vertical segment 519c is separated from corners 607 and 609. Each vertical segment 519 may be separated from one corner, as shown for vertical segment 519a, or from both corners, as shown for vertical segments 519b and 519c. For example, every vertical segment may be separated from both corners of a side of a respective edge pin. In some embodiments, the routing zone (e.g. 517, 523) is not reduced, for instance, when there are no critical corners, as shown in FIG. 5B.

Additionally or alternatively, edge pins may be designated as decomposable using separate masks. For example, edge pin 511 is designated as decomposable in the M1 layer using a first mask (or color space), and edge pin 515 is designated as decomposable in the M1 layer using a second mask. Further, the distance each vertical segment is separated from corners (e.g., 601-609) may be based on a side-to-side, tip-to-side, or tip-to-tip minimum resolution of a single patterning, for at least one of a plurality of masks, or a combination thereof. For instance, vertical segment 519a is separated from corner 601 by a maximum of a side-to-side, tip-to-side, or tip-to-tip minimum resolution of a single patterning of the first mask. Additionally, or alternatively, vertical segment 519c is separated from corners 607 and 609 by a maximum of a side-to-side, tip-to-side, or tip-to-tip minimum resolution of a single patterning of the second mask. In another example, vertical segment 519b is separated from corners 603 and 605 by a maximum of a side-to-side, tip-to-side, or tip-to-tip minimum resolution of a single patterning of the first and second masks.

In addition, a critical corner may be determined based on the corner being separated from an outer edge of a cell by another edge pin. For example, corner 601 is designated as a critical corner because corner 601 is separated from an outer edge of cell 501 by edge pin 513. Additionally, vertical segments (e.g., 519a, 519b, and 519c) can be separated from critical corners. For example, vertical segment 519a is separated from corner 601 based on corner 601 being designated as a critical corner. Further, vertical segments may be separated from critical corners by a predefined or critical distance (based on a side-to-side, tip-to-side, or tip-to-tip minimum resolution of a single patterning, for at least one of the plurality of masks, or a combination thereof).

Figure 7:
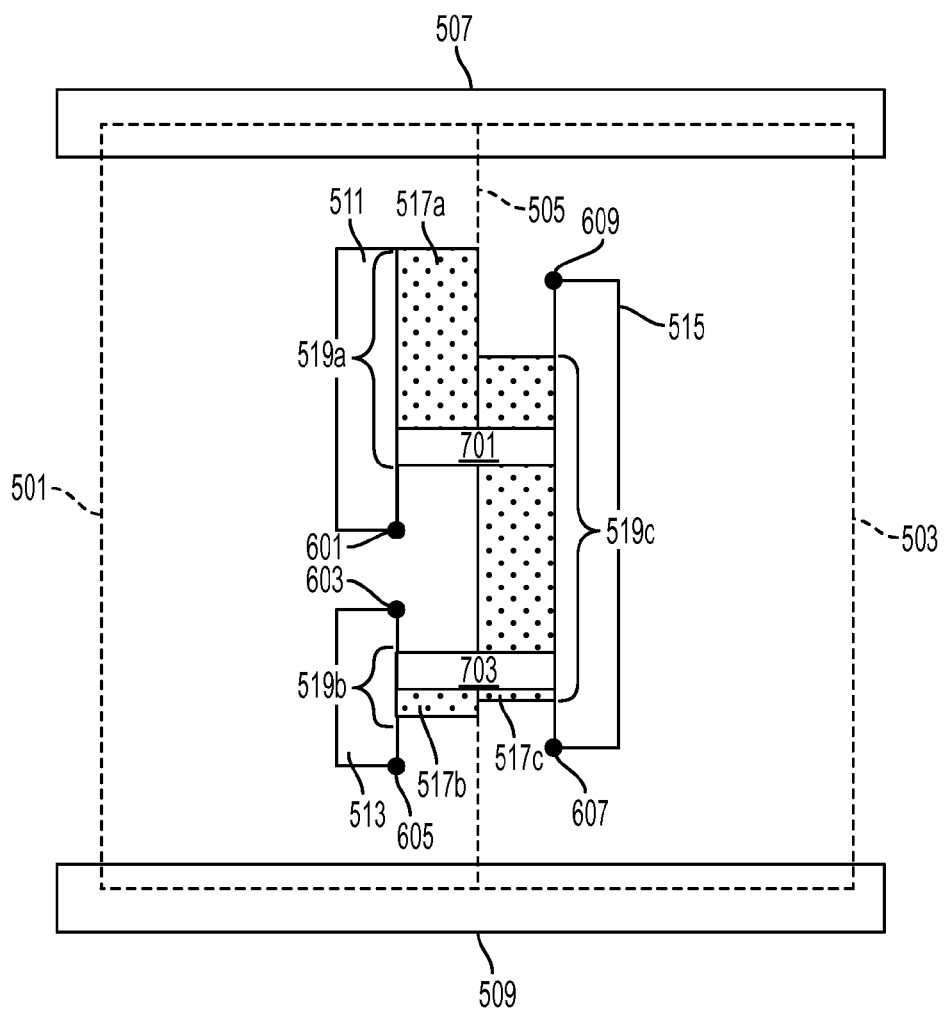

Adverting to FIG. 7, a M1 B2B route 701 is placed in the routing zone 517 to connect edge pins 511 and 515, and a M1 B2B route 703 is placed in the routing zone 517 to connect edge pins 513 and 515. As previously noted, the use of M1 B2B routes to connect edge pins increases routing efficiency, chip scaling, and circuit performance of a resulting IC design. Additionally, M1 B2B routes 701 and 703 may be designated to cause no color conflict (e.g., decomposable) with the first and second edge pins based on the route being placed inside the routing zone. As such, P&R tools may further benefit from the use of a routing zone (e.g., 517, 523) because the P&R tools may omit a determination using traditional color or DPT rules, resulting in less computation effort.

Figure 8:
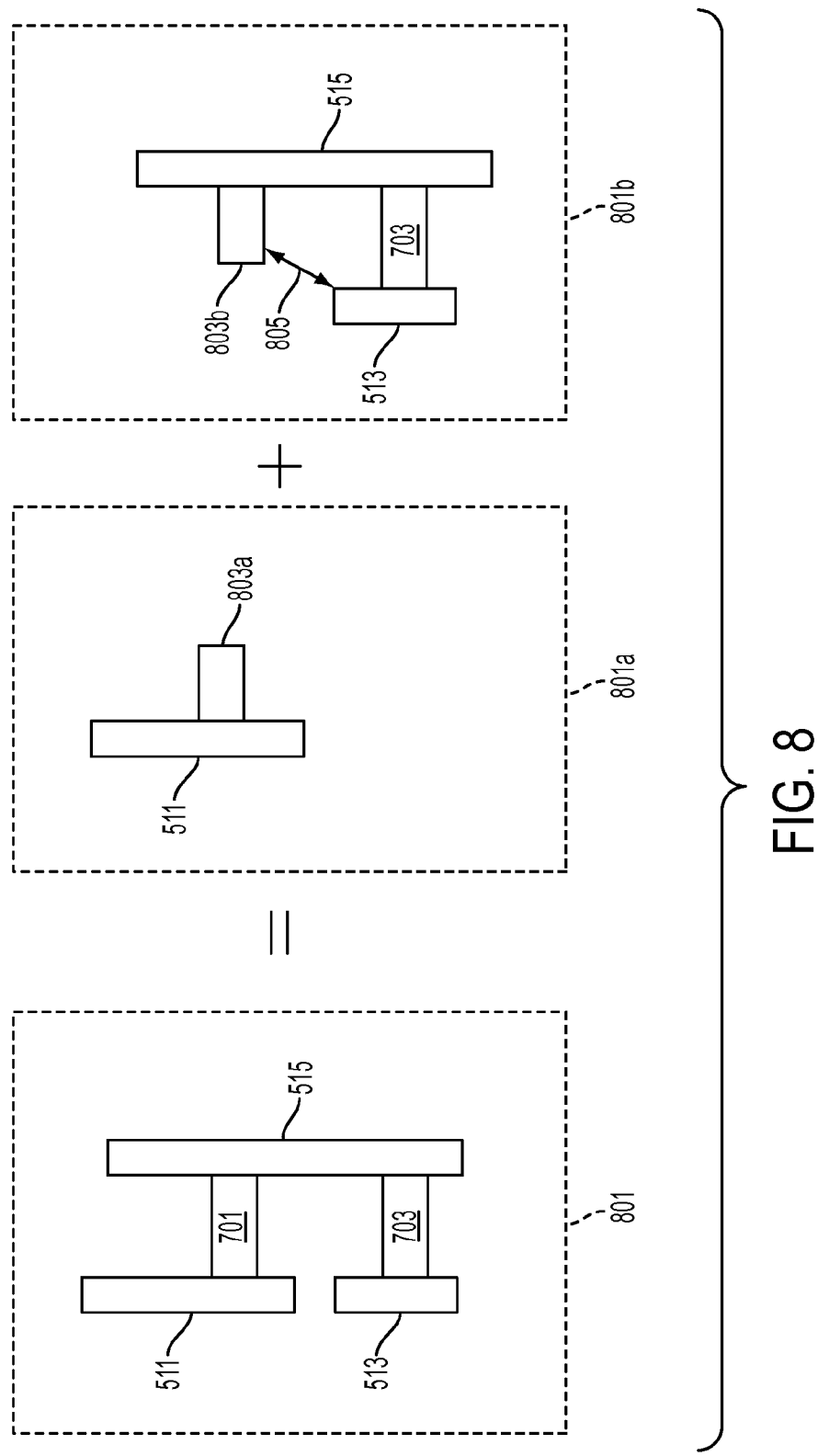

Adverting to FIG. 8, a target pattern 801 for the M1 layer includes edge pins 511, 513, and 515, and M1 B2B routes 701 and 703. A first mask is designated to decompose a partial pattern 801a (and/or first color space) having edge pin 511, and a part 803a of M1 B2B route 701. Similarly, a second mask (and/or second color space) is designated to decompose a partial pattern 801b having edge pins 513 and 515, a part 803b of M1 B2B route 701, and M1 B2B route 703.

As previously described, M1 B2B routes (e.g., 701, 703, etc.) may be placed in routing zones (e.g., 517, 523) configured to ensure decomposability (of the routes using DPT). Placing a M1 B2B route in a routing zone can ensure the M1 B2B route forms zero odd cycles with M1 features. For example, a M1 B2B route (not shown) placed in routing zone 523 ensures the M1 B2B route forms zero odd cycles with inside pin 521. Further, routing zones can ensure decomposability by, for instance, separating each vertical segment from corners of a respective side of an edge pin by at least a minimum resolution (e.g., tip-to-tip, side-to-side, tip-to-side, etc.) of single patterning for a mask (e.g., the first mask, second mask, or a combination thereof). As such, a placement of M1 B2B routes 701 and 703 within the routing zone 517 can insure, for instance, that a distance 805 separating part 803b of M1 B2B route 701 from edge pin 513 exceeds a predefined distance and/or a minimum resolution (e.g., tip-to-tip, side-to-side, tip-to-side, etc.) of the first mask, second mask, or combination thereof. Additionally, the routing zone (e.g., 517) may be configured (e.g., vertical segments are separated from corners) such that a distance (not shown) separating route 703 from edge pin 511 (and part 803b of M1 B2B route 701) exceeds a predefined distance and/or a minimum resolution (e.g., tip-to-tip, side-to-side, tip-to-side, etc.) of the first mask, second mask, or combination thereof. As such, the methods described in FIGS. 5 through 8 can guarantee M1 decomposability of a target design using DPT.

Figure 3:
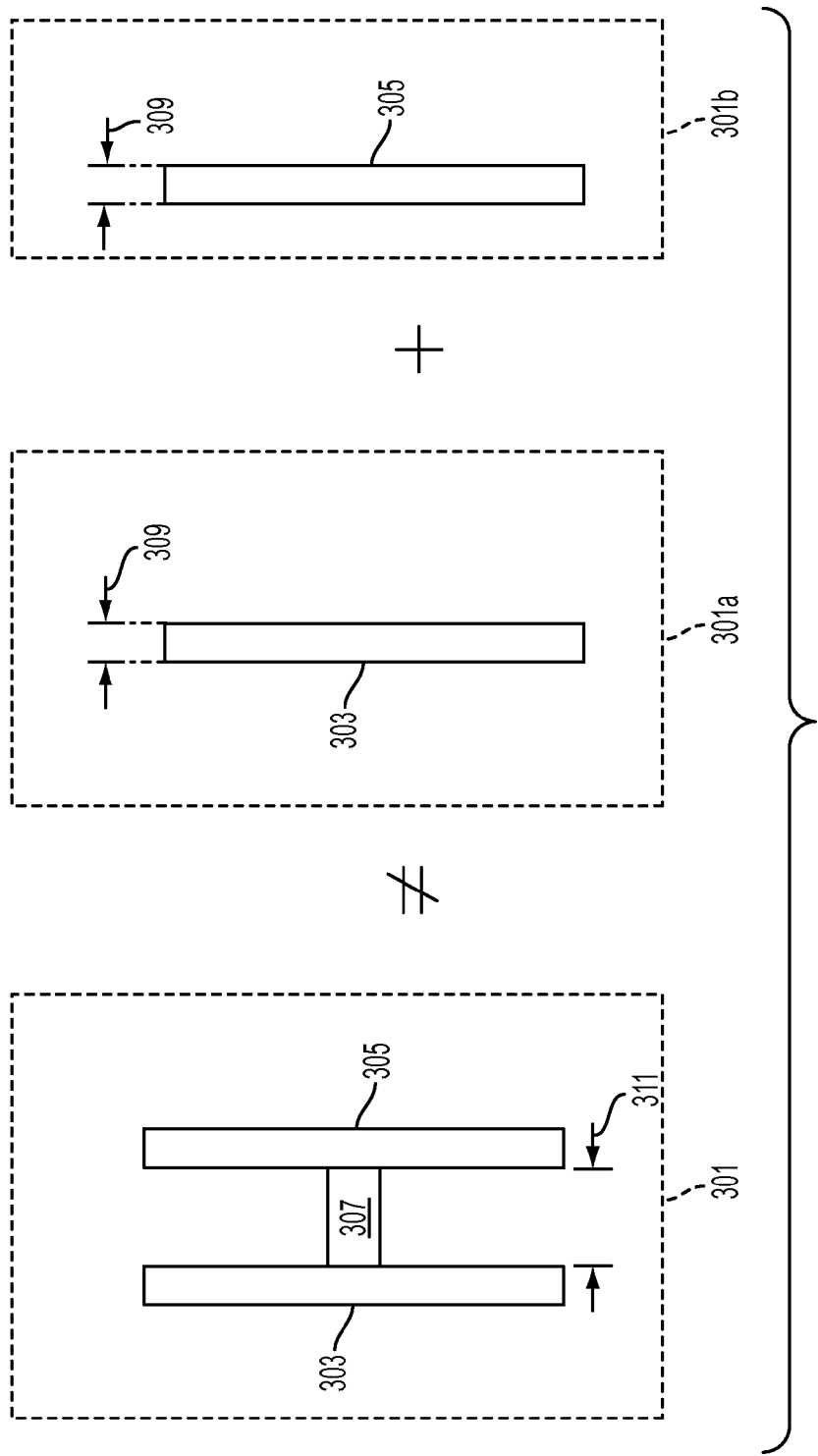
FIG. 3 illustrates an exemplary inefficient P&R layout of a M1 layer utilizing a traditional color DPT process.
Figure 4:
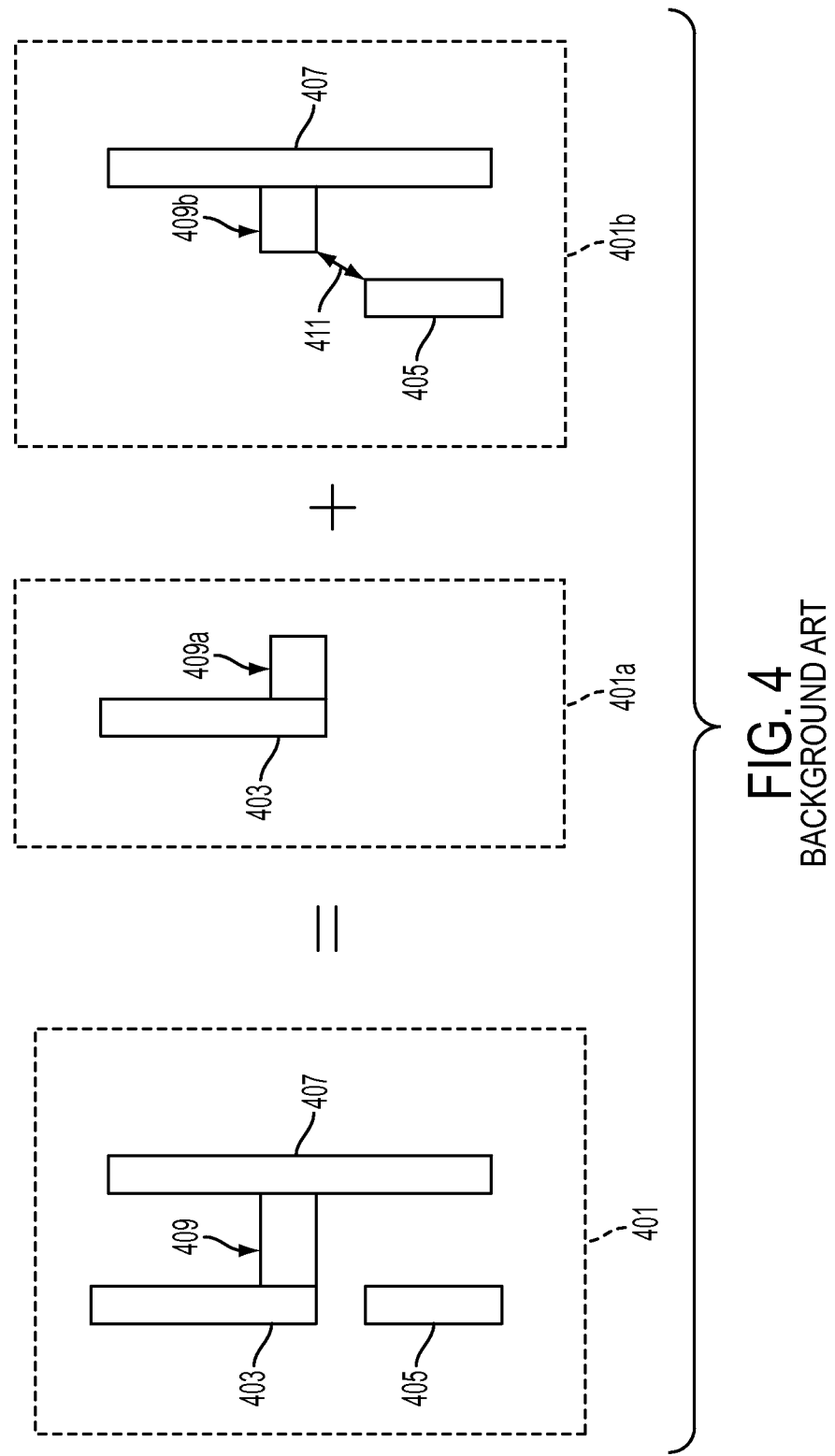
FIG. 4 illustrates an exemplary P&R layout of a M1 layer utilizing a traditional colorless DPT process that is not decomposable.

As previously noted with respect to FIG. 3, traditional color rules may prevent M1 B2B routes (e.g., M1 B2B route 701 and 703) from being generated between edge pins designated to be decomposed by separate masks (e.g., utilizing DPT). However, methods described in FIGS. 5 through 8 allow such M1 B2B routes to be generated. For example, M1 B2B route 701 may be generated regardless of whether the M1 B2B route 701 (or target pattern 801) contains odd cycles. Thus, the methods described in FIGS. 5 through 8 may be used to generate additional M1 B2B routes as compared to traditional color P&R techniques, resulting in increased routing efficiency, chip scaling, and circuit performance of a resulting IC design.

The embodiments of the present disclosure can achieve several technical effects, including use of DPT to form M1 B2B routes, increased routing efficiency, chip scaling, and circuit performance. The present disclosure enjoys industrial applicability in any circuit design, particularly in IC designs utilizing DPT and in designs for 20 nm and 14 nm manufacturing technologies and below.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   determining a boundary abutting first and second cells in an integrated circuit (IC);
   determining a side of a first edge pin in the first cell facing a side of a second edge pin in the second cell determining a side of a third edge pin in the first cell facing the side of the second edge pin;
   determining a first vertical segment of at least a portion of the side of the first edge pin and a second vertical segment of at least a portion of the side of the second edge pin determining a third vertical segment comprising at least a portion of the side of the third edge pin;
   designating an area between the first vertical segment and the boundary as a first portion of a routing zone;
   designating, by a processor, an area between the second vertical segment and the boundary as a second portion of the routing zone, wherein a route placed inside the routing zone is designated to be decomposable; and
   designating an area between the third vertical segment and the boundary as a third portion of the routing zone.

2. The method according to claim 1, wherein the first vertical segment is separated from at least one corner on the side of the first edge pin by at least a predefined distance.

3. The method according to claim 2, wherein the first and second edge pins are designated as decomposable in a single layer using a plurality of masks, the method comprising:
   determining the predefined distance based on a side-to-side, tip-to-side, or tip-to-tip minimum resolution of a single patterning, for at least one of the plurality of masks, or a combination thereof.

4. The method according to claim 2, wherein the first vertical segment is separated from both corners on the side of the first edge pin by at least the predefined distance.

5. The method according to claim 1, comprising:
   wherein the third vertical segment is separated from at least one corner on the side of the third edge pin by at least the predefined distance.

6. The method according to claim 5, wherein the second vertical segment is separated from at least one corner on the side of the second edge pin by at least the predefined distance.

7. The method according to claim 5, further comprising:
   determining a first critical corner on the side of the first edge pin based on the first critical corner being separated from an outer edge of the first cell by the third edge pin, wherein the first vertical segment is separated from the first critical corner by at least the predefined distance; and
   determining a second critical corner on the side of the third edge pin based on the second critical corner being separated from an outer edge of the first cell by the first edge pin, wherein the third vertical segment is separated from the second critical corner by at least the predefined distance.

8. The method according to claim 1, comprising:
   designating a route, connecting the first and second edge pins, to be decomposable based on the route being placed inside the routing zone.

9. The method according to claim 8 comprising:
   designating the first edge pin to be decomposed in a single layer using a first mask;
   designating the second edge pin to be decomposed in the single layer using a second mask; and
   designating the route to be decomposed in the single layer using the first and second masks.

10. A circuit comprising:
    a boundary abutting first and second cells in an integrated circuit (IC);
    a side of a first edge pin in the first cell facing a side of a second edge pin in the second cell;
    a side of a third edge pin in the first cell facing the side of the second edge pin;
    a first vertical segment of at least a portion of the side of the first edge pin and a second vertical segment of at least a portion of the side of the second edge pin;

a third vertical segment comprising at least a portion of the side of the third edge pin;

an area between the first vertical segment and the boundary as a first portion of a routing zone;

an area between the second vertical segment and the boundary as a second portion of the routing zone, wherein a route placed inside the routing zone is designated to be decomposable; and an area between the third vertical segment and the boundary as a third portion of the routing zone.

11. The circuit according to claim 10, wherein the first, second, and third edge pins are formed in a single layer.

12. The circuit according to claim 11, wherein the single layer further comprises a plurality of routes connecting the first, second, and third edge pins.

13. The circuit according to claim 12, wherein the routes and first, second, and third edge pins have a minimum resolution less than a minimum resolution of single patterning of a mask associated with the single layer, the minimum resolution of the routes and edge pins being based on a side-to-side, tip-to-side, and tip-to-tip minimum resolution of the routes and edge pins.

14. The circuit according to claim 13, wherein each of the routes is separated from at least one corner of each edge pin connected by the route by at least the minimum resolution of single patterning.

15. The circuit according to claim 13, wherein each of the routes is separated from corners of each edge pin connected by the route by at least the minimum resolution of single patterning.

16. The circuit according to claim 13, wherein at least one of the routes is decomposed in the single layer by a plurality of masks.

17. A method comprising:
determining a boundary abutting first and second cells in an integrated circuit (IC);
determining a side of a first edge pin in the first cell facing a side of a second edge pin in the second cell;
designating the first edge pin to be decomposed in a single layer using a first mask;

designating the second edge pin to be decomposed in the single layer using a second mask;

determining a first vertical segment of at least a portion of the side of the first edge pin, wherein the first vertical segment is separated from at least one corner on the side of the first edge pin by at least a predefined distance, and wherein the predefined distance is based on a side-to-side, tip-to-side, or tip-to-tip minimum resolution of a single patterning of the first and/or second masks, or a combination thereof;

determining a second vertical segment of at least a portion of the side of the second edge pin, wherein the second vertical segment is separated from at least one corner on the side of the second edge pin by at least the predefined distance;

designating an area between the first vertical segment and the boundary as a first portion of a routing zone;

designating, by a processor, an area between the second vertical segment and the boundary as a second portion of the routing zone;

designating a route connecting the first and second edge pins to be decomposable based on the route being placed inside the routing zone; and designating the route to be decomposed in the single layer using the first and second masks.

18. The method according to claim 17, wherein the first vertical segment is separated from both corners on the side of the first edge pin by at least the predefined distance, and wherein the second vertical segment is separated from both corners on the side of the second edge pin by at least the predefined distance.

19. The method according to claim 17, comprising:
determining a critical corner on the side of the first edge pin based on the critical corner being separated from an outer edge of the first cell by another edge pin, wherein the first vertical segment is separated from the first critical corner by at least the predefined distance.

* * * * *